United States Patent
Fidler et al.

(10) Patent No.: US 10,584,852 B2
(45) Date of Patent: Mar. 10, 2020

(54) LIGHT SOURCE HAVING SOLID-STATE LASER IRRADIATING SINGLE-CRYSTAL PHOSPHOR WITH SPECIFIC COMPOSITION

(71) Applicant: CRYTUR, spol.s.r.o., Turnov (CZ)

(72) Inventors: Tomas Fidler, Decin (CZ); Jan Kubat, Zdar u Mnichova Hradiste (CZ); Stepan Novotny, Bakov nad Jizerou (CZ); Jindrich Houzvicka, Turnov (CZ)

(73) Assignee: CRYTUR, SPOL.S R.O., Turnov (CZ)

( * ) Notice: Subject to any disclaimer, the term of this patent is extended or adjusted under 35 U.S.C. 154(b) by 527 days.

(21) Appl. No.: 15/318,418

(22) PCT Filed: May 5, 2015

(86) PCT No.: PCT/CZ2015/000040
§ 371 (c)(1),
(2) Date: Dec. 13, 2016

(87) PCT Pub. No.: WO2015/169270
PCT Pub. Date: Nov. 12, 2015

(65) Prior Publication Data
US 2017/0241619 A1     Aug. 24, 2017

(30) Foreign Application Priority Data

May 5, 2014   (CZ) .................................. 2014-302

(51) Int. Cl.
*F21V 9/30* (2018.01)
*C09K 11/77* (2006.01)
(Continued)

(52) U.S. Cl.
CPC ............ *F21V 9/30* (2018.02); *C09K 11/7706* (2013.01); *C09K 11/7774* (2013.01);
(Continued)

(58) Field of Classification Search
CPC ....... F21V 9/30; F21V 9/08; H01L 2251/5376
See application file for complete search history.

(56) References Cited

U.S. PATENT DOCUMENTS 5,535,230 A * 7/1996 Abe .......................... F21K 9/69
250/504 R
6,630,691 B1 * 10/2003 Mueller-Mach ........ H01L 33/08
257/103

(Continued)

FOREIGN PATENT DOCUMENTS

CZ           300 631 B6    7/2009
EP         2 202 444 A1    6/2010
(Continued)

*Primary Examiner* — Ismael Negron
(74) *Attorney, Agent, or Firm* — Jacobson Holman, PLLC.

(57) ABSTRACT

The light source includes a high-efficiency solid-state laser source emitting excitation coherent radiation, and a single crystal phosphor forming an optic element for receiving the excitation coherent radiation and emitting light with desired parameters. The single crystal phosphor is made of garnets conforming to the general formula $(A_x,Lu_{1-x})_a Al_b O_{12}:Ce_c$ formula, or from a single crystal material of perovskite structure conforming to the general formula $B_{1-g}AlO_3:D_q$.

18 Claims, 7 Drawing Sheets

(51) Int. Cl.
*F21V 13/12* (2006.01)
*F21K 9/64* (2016.01)
*F21V 8/00* (2006.01)
*H01S 5/00* (2006.01)
*F21V 3/00* (2015.01)
*F21V 9/08* (2018.01)
*F21V 15/01* (2006.01)
*F21Y 115/30* (2016.01)
*F21K 9/61* (2016.01)
*F21Y 115/10* (2016.01)
*H01S 5/022* (2006.01)
*H01S 5/40* (2006.01)

(52) U.S. Cl.
CPC ............ *C09K 11/7792* (2013.01); *F21K 9/64* (2016.08); *F21V 3/00* (2013.01); *F21V 9/08* (2013.01); *F21V 13/12* (2013.01); *F21V 15/01* (2013.01); *G02B 6/0008* (2013.01); *H01S 5/005* (2013.01); *F21K 9/61* (2016.08); *F21Y 2115/10* (2016.08); *F21Y 2115/30* (2016.08); *H01S 5/02212* (2013.01); *H01S 5/4025* (2013.01)

(56) References Cited

U.S. PATENT DOCUMENTS

| | | | | |
|---|---|---|---|---|
| 7,189,340 | B2* | 3/2007 | Shimomura | C09K 11/0883 252/301.4 F |
| 7,235,189 | B2* | 6/2007 | Hohn | C09K 11/7718 252/301.36 |
| 7,356,054 | B2* | 4/2008 | Hama | A61B 1/00096 372/21 |
| 7,597,823 | B2* | 10/2009 | Tamaki | C01B 21/0602 252/301.4 F |
| 7,758,224 | B2* | 7/2010 | Hama | A61B 1/0653 362/555 |
| 8,558,265 | B2* | 10/2013 | Raring | H01L 33/502 257/13 |
| 9,719,014 | B2* | 8/2017 | Fiedler | C09K 11/7728 |
| 2004/0200964 | A1 | 10/2004 | Lefaucheur et al. | |
| 2005/0051790 | A1* | 3/2005 | Ueda | C09K 11/595 257/99 |
| 2008/0283864 | A1 | 11/2008 | LeToquin et al. | |
| 2010/0102707 | A1* | 4/2010 | Fukuda | C09K 11/0883 313/503 |
| 2011/0182072 | A1* | 7/2011 | Shimizu | C09K 11/7739 362/293 |
| 2011/0280033 | A1 | 11/2011 | Kishimoto et al. | |
| 2017/0015902 | A1* | 1/2017 | Weiler | C09K 11/655 |

FOREIGN PATENT DOCUMENTS

| | | |
|---|---|---|
| WO | 2009/012484 A1 | 1/2009 |
| WO | 2009/126272 A1 | 10/2009 |
| WO | 2009/134433 A3 | 11/2009 |
| WO | 2010/143086 A1 | 12/2010 |
| WO | 2012/012354 A2 | 1/2012 |
| WO | 2012/110009 A1 | 8/2012 |
| WO | 2012/170266 A1 | 12/2012 |
| WO | 2012/172672 A1 | 12/2012 |
| WO | 2013/161683 A1 | 10/2013 |
| WO | 2014/173376 A1 | 10/2014 |

* cited by examiner

LIGHT SOURCE HAVING SOLID-STATE LASER IRRADIATING SINGLE-CRYSTAL PHOSPHOR WITH SPECIFIC COMPOSITION

FIELD OF THE INVENTION

The invention relates to efficient white light emitting diodes for generally widespread utilization, including luminescent material emitting light in dependence on the luminescent material excitation with excitation coherent radiation.

BACKGROUND OF THE INVENTION

Currently, the lighting technology utilizes a wide spectrum of light sources, such as light sources with filaments, halogen light sources, high-intensity discharge lamps (HID), fluorescent lamps and, lately, more and more often semiconductor light sources, such as light emitting diodes (LED). The alternative to the currently introduced light sources of the LED type appears to be a laser diode (LD). The laser diode is, same as the LED, a semi-conductor device which converts electrical energy directly into light.

Currently, the output of the blue laser diodes as one of the types of solid-state source of coherent light progressed significantly and it is therefore possible to consider the utilization of laser in lighting technology. The semi-conductor laser achieves very high luminance which, currently, cannot be attained with any other known light source, with values more than 1000× greater in comparison with the conventional surface lighting LEDs. The luminance of the high efficiency LED light sources is 60 $cd/mm^2$-100 $cd/mm^2$ as opposed to blue lasers which are able to generate luminance exceeding 500 $cd/mm^2$. Currently, blue laser diodes based on the InGaN technology are available on the market.

In case of high current density (~$kA/cm^2$), necessary to attain high luminescence intensity, lasers are the most efficient converters of electrical energy into optical energy. The laser diode produces monochromatic coherent light with high luminance (great energy density), narrow spectrum width and narrow emission characteristic which can thus be focused easily and excellently. The laser diode therefore represents an efficient source, providing a promising condition for a high density output light source.

Due to the high luminance produced by the laser diode on a small emission surface it is possible to achieve reduction of dimensions and weight and, subsequently, a larger design variability of light sources. The laser diodes therefore appear to be a logical successor of the light emitting diodes.

To obtain white light when utilizing a laser diode, it is possible to use the additive composition of the blue, green and red laser light beams. The disadvantages of this procedure consist of the fact that lighting requires a higher electrical energy consumption, that is by three laser diodes at the same time, and, furthermore, the light sources requires very exact optics for mixing the laser beams in one white light beam. The different thermal ageing of the individual diodes results in the changes of the resulting color spectrum during lifetime.

Presently, a laser diode begins to be combined with a phosphor which is a kind of luminescent material. The phosphor is any material that absorbs excitation light of a certain wavelength and emits it on a different wavelength in the visible spectrum of light wavelengths. This phenomenon occurs most frequently during the conversion of the short wavelength light into the longer wavelength light and is called "downconversion".

The phosphor transforms the light that is being excited into the light of the required wavelength. When doing so, there are energy losses in the phosphor both due to the conversion itself (Stokes shift) and to the light scattering or reflection. When utilizing a laser diode, it is expected that it will be necessary to ensure the heat dissipation from the phosphor of the ~1W output. Based on the requirements of the given application, more laser diodes can be utilized for phosphor excitation, however, with increased demands for phosphor and diodes assembly cooling.

The light beam, produced by the laser diode, is characterized by high energy density, narrow profile and high directionality, therefore, new requirements are placed on the phosphor. It is thus necessary to use the phosphor in such a form that can withstand high loading without damaging or degradation. One solution is to utilize a rotational phosphor to spread the incident power onto a larger surface, as it is, for example, with the X-ray radiation sources or as stated in the WO2012172672A patent application. The rotating parts are, however, generally more demanding for construction, maintenance and, particularly, operation and are a potential source of defects. This solution is not suitable for the general application and therefore a static solution must be found.

When illuminating phosphors, assembled in various matrixes, with a laser light beam of the 1 W output, the matrixes based on polycarbonates, glass or aluminium are damaged after 5 minutes due to the released heat. A ceramic matrix can withstand the thermal conditions. However, its temperature can exceed 300° C. The final temperature, to which the phosphor is heated during the conversion, depends too on the volume of the used phosphor, since its decreasing volume results in a non-negligible increase in temperature. Under high temperatures, there occur negative phenomena too, such as temperature luminescence quenching, and the whole light source can be overheated which furthermore increases the demands on cooling.

One of the disadvantages of utilizing laser diodes is due to the fact that with laser diodes there is a large thermal dependence since the increase in the temperature on the laser diode causes a significant decrease in its efficiency and shortening of its life. Thus it is necessary to eliminate the supply of other heat generated in the phosphor back to the laser diode chip. One of the available solutions is to utilize a "remote phosphor" (as described in the patent files WO2010/143086A1; EP2202444; WO2009/134433A3) which is used in many construction assemblies. Thanks to the physical separation of the excitation source and the phosphor it is possible to control the heat management well. The solution to the heat dissipation from the phosphor is described e.g. in the patent application US20110280033. When physically separating the source of the excitation light and the phosphor, it is possible to conduct the excitation light from the laser diode to the phosphor with optical fibers and it is possible to use preferably the small emitting area and a high directionality of the beam generated by the laser diode for simple coupling of the beam in the optic fiber.

Another alternative is to utilize the phosphor in the form of a single crystal. The single crystal represents a highly arranged, perfect material where atoms are located in lattice positions. Due to this fact, the light scattering is minimal in the single crystal phosphor. In the single crystal material, the doping atoms of the Ce chemical element are always distributed in the position in which they act as efficient luminescence centers.

The amount of the blue light, absorbed and subsequently converted by the phosphor, is directly proportionate to the concentration of the $Ce^{3+}$ doping ion. For this reason the concentration of the $Ce^{3+}$ doping ions is deliberately increased in the conventional powder phosphors. This results in higher heat generation in the phosphor which, if it is not efficiently taken away, may heat up the phosphor to temperatures exceeding 200° C. and there may occur temperature quenching of the luminescence which denotes thermally dependent non-radiant processes that decrease luminescent efficiency. Nevertheless, the temperature quenching with a single crystal phosphor on the basis of YAG:Ce occurs only above the temperature of ~350° C.

Due to the perfect atoms arrangement in the crystal lattice, the single crystal phosphor achieves high thermal conductivity. The dissipation of the heat, generated during luminescence, thus shall be more effective than with current powder phosphors, spread in silica gel, glass matrix (PiG—phosphor-in-glass) or in a matrix in the form of a polycrystalline structure.

Because of the absence of grain boundaries and minimum of defects, contained in the single crystal, there is only small scattering of the generated heat. It is therefore possible to use a lower concentration of dopant or dopants which, subsequently, reduces the phenomenon called concentration quenching of luminescence, responsible for the reduction of luminescence efficiency. The lower concentration of the $Ce^{3+}$ dopant in the single crystal phosphor results too in the lower amount of heat, generated during luminescence with the Stokes shift and the reduction of thermal loading. At the same time, if another element which has a different atom diameter than the original is deliberately introduced in the phosphor crystal lattice, there will occur expansion or distortion of the crystal lattice and, subsequently, the shift of the phosphor emission spectrum.

When using a laser diode as the excitation source, it is necessary to ensure its safe use ("eye safety"). This can be attained either by using a sufficient volume of the single crystal in such a manner that there is sufficient conversion of the laser beam, or by using a reflective element located behind the phosphor in the direction of the laser diode beam so that it should reflect the radiation passed through the phosphor back to the phosphor where it will be fully absorbed and converted.

The WO 2012/170266 patent application utilizes a phosphor on the basis of YAG:Ce where a portion of the Al atoms may be replaced with atoms of the Ga chemical element and a portion of the Y atoms replaced with Ce atoms. A solid-state lighting device is used as the excitation source, which can be a LED or a laser diode. The disadvantages of the above described solution consist of the fact that their absorption and emission spectra cannot be shifted in such a manner that the resulting light meets the conditions for non-disturbing long-term lighting of e.g. households.

The PV 2013-301 patent application deals with the application of the YAG, LuYAG and GGAG single crystal phosphors into the light sources which are doped with Ce, Ti, Cr, Eu, Sm, B, C, Gd and Ga and which are excited in the light source with a blue LED. The excitation source from the light emitting diodes does not attain the above stated quality of the laser diode light beam, therefore the light sources produced in this way are not very powerful.

In the WO 2009/126272 patent application, a single crystal phosphor on the basis of YAG is similarly used and it emits in the yellow, green, orange or red spectrum part in combination with the light emitting diodes. The disadvantages of this solution again consist in LEDs being used as an excitation light source.

In the patent application number US20080283864A, there is used as a phosphor in the solid-state light emitting device a single crystal material, composed of $Y_3Al_5O_{12}$ doped with Ce or Eu, or $Ca_xSr_yMg_{1-x-y}AlSiN_3$ doped with Ce, or $Sr_x$-$Ga_yS_z$ doped with Ce, or $Sr_{2-x}Ba_xSiO_4$ doped with $Eu^{2+}$ (BOSE), or $Eu^{2+}$ doped single crystal from the group $Ca_xSr_{1-x}AlSiN_3$, $Sr_xGa_yS_z$, α-SiAlON, siliceous garnet, $Y_2O_2S$ and $La_2O_2S$. The content of Ce ranges between 0.1 to 20% and of Eu between 0.5 to 20%. The disadvantages of the stated solution consist in the fact that due to the chemical composition of the single crystal phosphor it is not possible to shift the limits of the absorption and emission spectra of this single crystal phosphor. The extracted light has unchangeable parameters and must be possibly combined with light from a different light source.

In the US20040200964A1 patent application, there are presented single crystal materials $Ce_xLu_{(1-x-z)}A_zAl_{(1-y)}B_yO_3$, where x=0.00005–0.2, y=0.00005–1, z=0–(1–x) and A is one or more from cations Y, Sc, La, Pr, Nd, Sm, Eu, Gd, Tb, Dy, Ho, Er, Tm, Yb, In, Ga; B is one or both cations Sc and Ga; and material $Ce_xLu_{(1-x-z)}A_z Al_{(1-y)}B_yO_3$, where x=0.00005 to 0.2, y=0.0 to 1.0, z=0.0005 to (1–x) and A is one or more from cations Sc, La, Pr, Nd, Sm, Eu, Gd, Tb, Dy, Ho, Er, Tm, Yb, In and B is one or both cations Sc and Ga, furthermore A contains one or two cations Y and Ga in the application of the scintillator which means utilizing its scintillation after excitation by high-energy radiation, such as X-ray, gamma or beta. The disadvantages of the stated single crystal material consist in its not being suitable for light sources for general usage, e.g. in households. The used excitation radiation is harmful to the health and is not suitable for common light application.

Polycrystalline phosphors, useable for light sources according to the current state of technology, have the following disadvantages which consist in the utilization of unsuitable excitation radiation, in their polycrystalline structure which leads to energy losses, in complicated realization of rotational phosphors and in worse heat management, leading to quenching and damage of radiation sources. Furthermore, the excitation radiation source is either harmful to the health, that is gamma, X-ray and UV excitation radiation, or the excitation radiation source is not sufficiently efficient as in case of e.g. LED excitation radiation sources whose light beam luminance is low and the light beam is divergent.

The known single crystal phosphors combined with excitation radiation laser sources are of such a construction that they do not enable the shift of the emission and absorption spectra, therefore the extracted light must be further combined and, as a result, such light sources are bigger and more costly.

The task of the invention is to remove the above stated drawbacks of the current solutions and to create a light source that would use a solid-state laser source of excitation radiation that would be more effective when converting electrical energy into excitation light radiation, that would include a manufactured single crystal phosphor, that would radiate extracted light of a pleasant color for long-term utilization e.g. in households and that could be well applied in various areas of human activity, necessitating various technical solution of light sources. The light source could be minimized, it would have low production costs, the extracted light would be bright enough and the light source would have no problems with heat management.

SUMMARY OF THE INVENTION

The set task is solved by creating a light source according to this invention, where the light source comprises at least one source of excitation coherent radiation, especially solid-state laser source, for emitting coherent excitation radiation, generally created by a laser diode. Furthermore, it comprises at least one single crystal phosphor containing at least one doping element for at least partial conversion of the excitation radiation into extracted light, with wavelengths in the visible spectrum.

The principle of the invention comprises the fact that the single crystal phosphor is formed with an oxide-type compound meeting the general formula $$(A_x,Lu_{1-x})_a Al_b O_{12}:Ce_c$$

where:
A is at least one of the chemical elements from the Y, Gd, Tb group,
a is a number from the value interval from 0.5 to 20,
b is a number from the value interval from 0.5 to 20,
c is a positive number from the value interval from 0.0005 to 0.2,
x is a positive number from the value interval from 0 to 1,
and the value of the stoichiometric ratio a:b ranges between 0.5 to 0.7.

The advantages of the single crystal phosphors can be found in the high efficiency of the conversion of light of one wavelength into light of a different wavelength, in good resistance against high temperature impact, in excellent thermal conductivity of the single crystal, in a relatively low consumption of rare earths, especially $Ce^{3+}$. The single crystal phosphor produced according to the above stated formula is garnet which is robust in itself and does not require additional carrier substrate as mechanical support when being used in the light source. The replacement of atoms in the crystal lattice results in the change of parameters of the extracted light, such as the increase in the color rendering index value and decrease in correlated color temperature. In the preferred embodiment of the light source according to the invention, the values of c and x numbers are defined by the intervals:

0.0005<c<0.03
0.0005<x<0.9999

The subject of the invention is too another embodiment where the single crystal phosphor containing at least one doping element is created by an oxide-type compound of the general formula:

$$B_{1-q}AlO_3:D_q$$

where:
B is at least one chemical element from the Y, Lu and Gd group,
D is at least one chemical element from the Eu, Sm, Ti, Mn, Pr, Dy, Cr and Ce group,
q is a number from the 0.0001 to 0.2 value interval,
and the contents of the chemical elements substituted by letter D ranges from 0.01 mol. % to 20 mol. %.

The advantages of a single crystal phosphor produced according to the stated formula are similar as with the preceding above described single crystal phosphor. Another advantage is that it is a material with perovskite structure, thus a different crystal field influences the doping ion which results in the shift of the phosphor emission spectra into a more pleasant color of the extracted light.

Both the materials according to the invention (garnet and perovskite structure) have very similar optic properties (refractive index, optic transparency, specific properties regarding absorption and emission) and are manufactured by current technologies of optical devices production so that the single crystal phosphor not only converts the light of one wavelength into another one but also works with the light. It can, for example, focus the light in one point, such as the optic lens, e.g. converging lens. As opposed to the polycrystalline phosphor which only converts the light and must be consequently fitted with e.g. glass optical elements, the single crystal phosphor material according to this invention can be directly manufactured in the optic element. Thus the construction of the light source can be simplified by the removal of complementary glass optic elements which leads to the decrease in price and possible miniaturization of light sources.

In another preferable embodiment of the light source according to the invention, the single crystal phosphor contains induced color centers connected with oxygen vacancies. The induced color centers influence the transmittance of the light through the phosphor crystalline structure and generate light with a new wavelength, which results in the emission of the extracted light of the required correlated color temperature.

In another preferable embodiment of the light source according to the invention, the single crystal phosphor is made from a single crystal ingot. The making from ingot ensures robustness for utilization in light sources without the necessity of using auxiliary carrier substrate, which enables a better heat dissipation and simpler construction of light sources.

In another preferable embodiment of the light source according to the invention, the solid-state laser source of has a maximum emission in the range of 340 nm to 480 nm and the extracted light from the single crystal phosphor is basically of a white color with the correlated color temperature ranging from 2700 K to 10000 K. Laser diodes emitting blue light are generally widespread and have low production costs. The extracted light from the phosphor is of a correlated color temperature corresponding to the daylight conditions which the human eye tolerates well without being excessively tired.

In another preferable embodiment of the light source according to the invention, the single crystal phosphor is provided with minimally one surface treatment selected from the group consisting of ground surface, polished surface, surface provided with an anti-reflex layer, structured surface and surface provided with a layer of crushed single crystal phosphor material. The surface treatments, combined with single crystal phosphor refractive index, preferably change the conditions for the occurrence of total reflection. Either, if need be, the total reflection can be minimized or the total reflection can be maximized, which results in the light leaving the phosphor only through the emission surface which is clearly defined. Applying the crushed single crystal phosphor material onto the surface increases the surface roughness which subsequently results in an efficient extraction of the extracted light and its excellent homogeneity.

In another preferable embodiment of the light source according to the invention, the deposited layer is composed of minimally two layers of single crystal phosphors with different parameters. By mixing the materials with different parameters from which the single crystal phosphors are produced, it is possible to mix different compositions which differ by color rendering index and correlated color temperature distribution.

In another preferable embodiment of the light source according to the invention, the single crystal phosphor is an optic element in the shape selected from the group consisting of a rectangular cuboid, hemisphere, spherical cap, right circular cone, pyramid, polyhedron or symmetrical shape for the extracted light emission in the desired direction. Shaping the single crystal phosphor into an optic element enables laying-out the excitation and emission surfaces according to the current application of the light source utilization. The fact that the optic element directs the extracted light by itself makes it possible to do away with the need for other optic elements and results in a significant simplification of the light source. Another advantage is that a well-selected shape of the optic element influences dissipation of heat.

In another preferable embodiment of the light source according to the invention, at least a portion of the optic element volume is structured to create color-homogenized scattered extracted light and/or to maximize the extracted light projection in the desired direction. Structuring volume of the single crystal phosphor results in an effective distribution of the excitation light beam which leaves the phosphor in the form of homogenized scattered light. It is also possible to structure at least a portion of the single crystal phosphor volume to concentrate and make easier the extraction of the extracted light just in the desired direction.

In another preferable embodiment of the light source according to the invention, there is connected to the single crystal phosphor a secondary phosphor whose extracted light has the emission maximum in the wavelengths ranging from 560 nm to 680 nm for the change of the correlated color temperature resulting from the combination of the extracted lights. If the correlated color temperature of the light from the light source, obtained by mixing the extracted light from the single crystal phosphor with the excitation light, do not achieve the requested parameters, it is suitable to utilize several kinds of phosphor at the same time which results in a significant and desired change of the correlated color temperature of the light from the light source.

In another preferable embodiment of the light source according to the invention, the single crystal phosphor is connected with a cooler. The cooler removes excessive heat, maintains a lower operational temperature of the phosphor and thus positively influences the durability of the light source.

In another preferable embodiment of the light source according to the invention, the source of the excitation coherent radiation and the single crystal phosphor are connected with a light guiding optic fiber or are connected with a light conducting planar optic waveguide, where the optic waveguide is connected to the single crystal phosphor with an optical bonding. To reduce the transfer of heat from the phosphor to the excitation source laser diode, it is good to separate both the members from each other, and to ensure the impinging of the excitation light on the phosphor excitation surface, it is possible to conduct the light beam via an optic fiber or an optic waveguide.

In another preferable embodiment of the light source according to the invention, there is an optic lens between the excitation coherent radiation source and the single crystal phosphor to scatter the excitation coherent radiation on the excitation surface of the single crystal phosphor. The optic lens distributes the excitation radiation spot beam onto the whole excitation phosphor surface which heats up evenly, as opposed to spot lighting, and thus extends its durability.

In another preferable embodiment of the light source according to the invention, the light source includes at least one carrier of the single crystal phosphor and at least one element to direct the extracted light from the single crystal phosphor. The single crystal phosphor carrier keeps the phosphor firmly in its place and the element directs the extracted light into the desired direction.

In another preferable embodiment of the light source according to the invention, the single crystal phosphor has the shape of an elongated rectangular cuboid or cylinder, side walls of the single crystal phosphor are polished and the face of the single crystal phosphor from which the extracted light is emitted, is ground, or is provided with an anti-reflex layer, or is provided with structuring to make the extraction of the extracted light easier. The elongated character of the single crystal phosphor and the treatment of the excitation surface enable the phosphor to conduct the light to the emission face from where the light is extracted in the desired direction.

In another preferable embodiment of the light source according to the invention, the excitation surface of the single crystal phosphor is simultaneously the emission surface too. Due to this, the phosphor can be adjusted so that the excitation light enters the phosphor only through its surface that also emits the extracted light which can be utilized in more complex applications where it is not possible, for example due to the lack of space, to keep the subsequent arrangement: excitation source, excitation surface, single crystal phosphor, emission surface.

In another preferable embodiment of the light source according to the invention, the single crystal phosphor is composed of at least two thin plates, arranged in a sandwich structure. This is an advantage especially for manufacturing of smaller volumes of the single crystal phosphor which are not suitable for the creation of an optic member. The arrangement of the phosphor into plates also better distributes the parallelly arranged excitation radiation beam.

In another preferable embodiment of the light source according to the invention, every thin plate is created from a single crystal phosphor of differing characteristics. This is suitable for mixing the resulting correlated color temperatures of the light from the light source.

The advantages of the light source according to the invention include an effective dissipation of heat from the light source, high efficiency of light wavelength transformation, material robustness and the single crystal phosphor structure, machinability of the single crystal phosphor with the aid of existing technologies for optic elements production and more efficient utilization of rare earth elements. Furthermore, the advantages include a large variability of surface modification of the single crystal phosphor to change the parameters of the total light reflection and manufacturing the optic member from the single crystal phosphor for the easier directing of light emission into the desired direction. Last but not least, the advantages include high luminance due to the utilized laser excitation light and variability of the extracted light maximum wavelengths which has a very positive influence on the total color temperature of the light, leaving the light source, which imitates light conditions of the day light that are most natural for the human eye.

DESCRIPTION OF THE DRAWINGS

The stated invention shall be more closely clarified in enclosed drawings, where.

DETAILED DESCRIPTION OF EMBODIMENTS OF THE INVENTION

It is understood that the below stated and depicted specific embodiments of the invention are represented for illustration and not as the limitation of the embodiments of the invention to the stated embodiments. Experts familiar with the state of the art will find or will be able to ensure, when performing routine experimentation, larger or smaller amount of equivalents to the specific embodiments of the invention which are described here. These equivalents shall be included in the extent of the following claims too.

Figure 1:
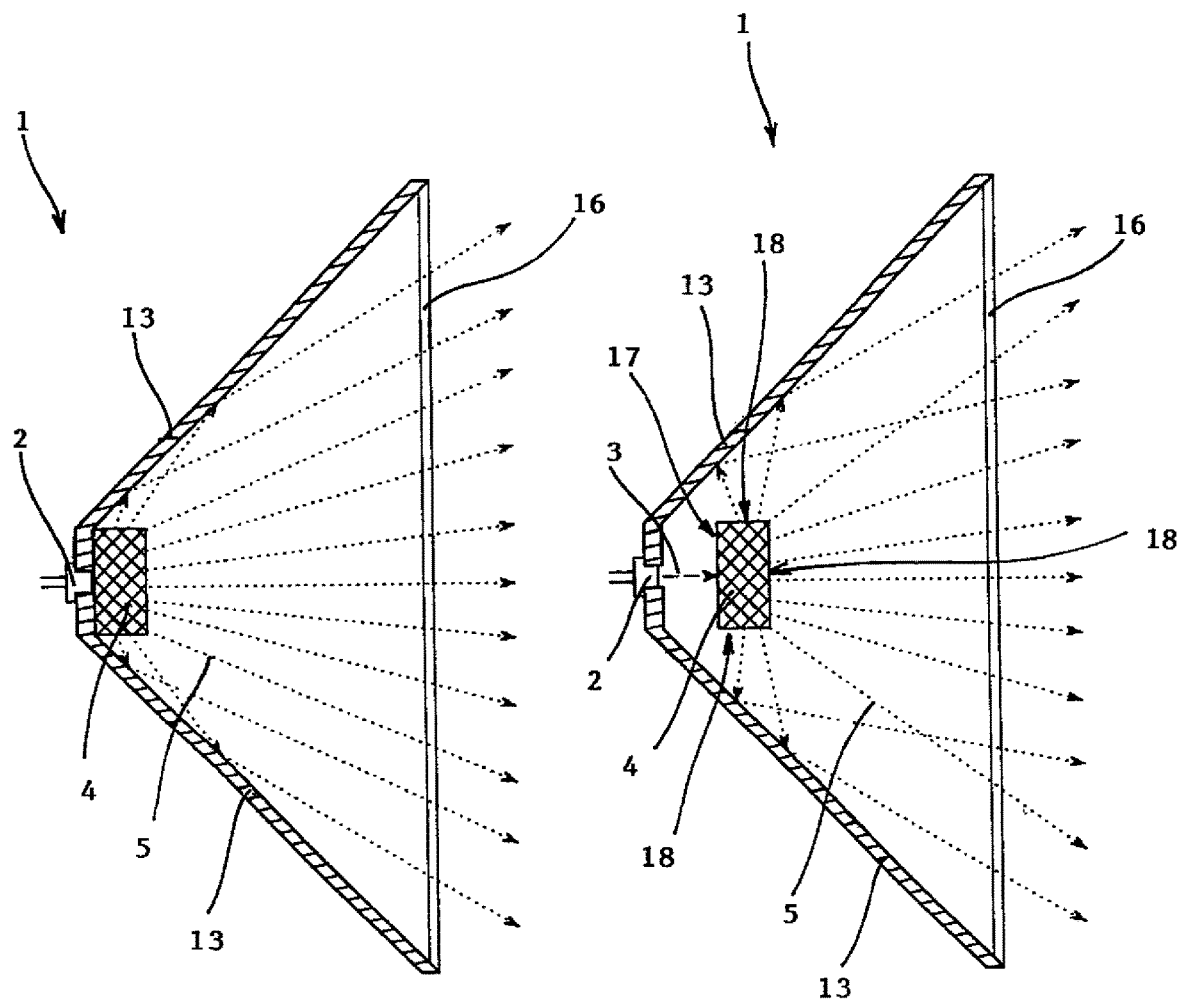
FIG. 1 illustrates a light source in which the location of the single crystal phosphor is right next to the excitation radiation source and, furthermore, a light source in which the location of the single crystal phosphor is remote from the excitation radiation source.

The light source 1 is depicted in a simplified manner in FIG. 1 where we can see it in cross-section. The basic parts of the light source 1 are the solid-state laser source 2 of the excitation coherent radiation 3 to which a single crystal phosphor 4 is fixed, or, possibly, the single crystal phosphor 4 is located in a more remote position from the source of the excitation coherent radiation 3. The single crystal phosphor 4 emits extracted light 5 which is directed by the element 13, created with an alumina cone whose internal wall has reflex treatment. The single crystal phosphor 4 is located at the top of the cone of the element 13. The internal space of the element 13 created by the cone is protected from the influence of the environment by a protective element 16 created with a transparent layer. The protective transparent layer representing the element 16 can be made of glass or clear heat resistant polymer. The element 13 for directing the extracted light 5 and the protective element 16 can be variably shaped for various applications of the light source 1.

The source of the excitation coherent radiation 3 is a solid-state laser source 2, created with an edge-emitting laser diode. The laser diode emits a coherent light beam with the wavelength in the area of 450 nm. The light beam created by the excitation radiation 3 incidences onto the excitation surface 17 of the single crystal phosphor 4, into the volume of which it penetrates. It is possible, for example, to use a laser diode based on the InGaN technology which emits from the edge.

The single crystal phosphor 4 is a luminescent material with a single crystal matrix $(Y_{0.15}Lu_{0.85})_3Al_5O_{12}$, which is doped with Ce or contains induced color centers connected with oxygen vacancies. In another embodiment of the light source 1 is $YAlO_3:Ti_{0.5}$ utilized.

The induced color centers are connected with oxygen vacancies which are present in the material due to the lack of oxygen during the single crystal growth. The adjustment of conditions during the single crystal growth is controlled. The induced color centers are connected with certain anomalies in the crystalline lattice which generate light of different wavelengths after incidence of the excitation radiation.

The resulting shape of the single crystal phosphor 4 corresponds to the specific application. For the sake of simplicity, it is created in the light sources 1 depicted in drawings as a low cylinder with wide faces which appears as a rectangle in section. The laser light beam is converted from its major part and the single crystal phosphor 4 starts to emit the emitted light 5 in all directions from the emission surface 18. A part of the excitation radiation 3 in the form of a laser light beam passes through the single crystal phosphor 4 and due to the passage through the single crystal phosphor 4 it loses its arranged character and mixes up with the extracted light 5 into the resulting light color which is suitable with its correlated color temperature and intensity for usage in household applications too.

The surface of the single crystal phosphor 4 may be treated in such a manner that parameters are changed for the creation or elimination of total reflection. The surface may be polished, provided with an anti-reflex layer 7 or with structuring 8 which makes light extraction easier.

The single crystal phosphor 4 shaped into an optic member defines with its shape the direction of the emission of emitted light. In some cases, the optic member volume is structured in such a manner that there is an easy light extraction from the single crystal phosphor 4.

Figure 2:
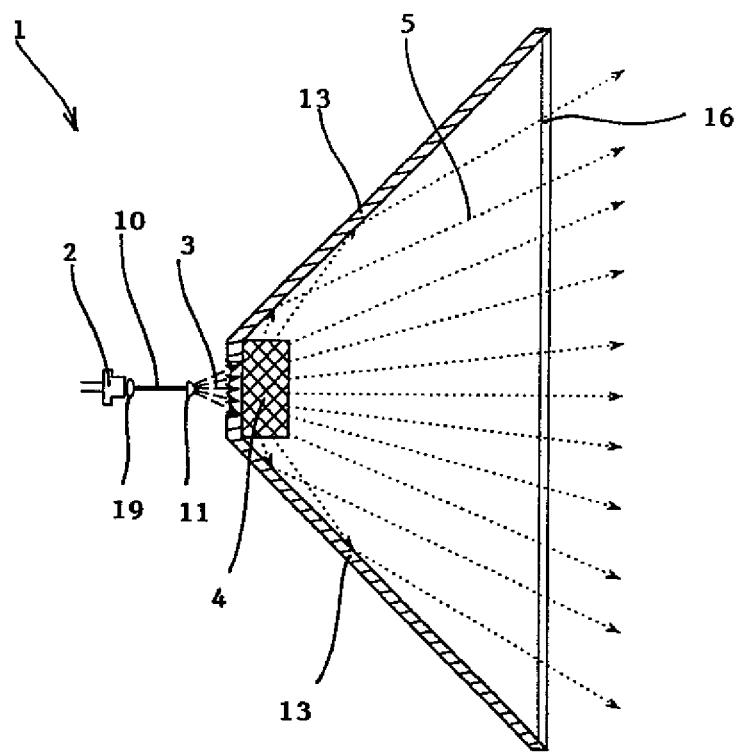
FIG. 2 depicts a light source where the excitation coherent radiation is conducted to the single crystal phosphor via an optic fiber.

FIG. 2 depicts the example of embodiment the light source 1, which is adjusted for lower heat transfer from the single crystal phosphor 4 back to the laser diode of the source 2 of the excitation radiation 3. The laser diode is in a remote position from the phosphor 4 and the excitation radiation 3 is conducted to the phosphor 4 via an optic fiber 10. To decrease the light energy losses, the excitation light beam is collimated with a collimation lens 19 in the optic fiber 10. The center of the light beam, the center of the collimation lens 19 and the center of the entrance into the optic fiber 10 lie in one common axis. The light beam extracted from the optic fiber 10 is scattered onto the excitation surface 17 of the single crystal phosphor 4 by projection apparatus optic lens 11. An optic waveguide can be used instead of the optic fiber 10.

Figure 3:
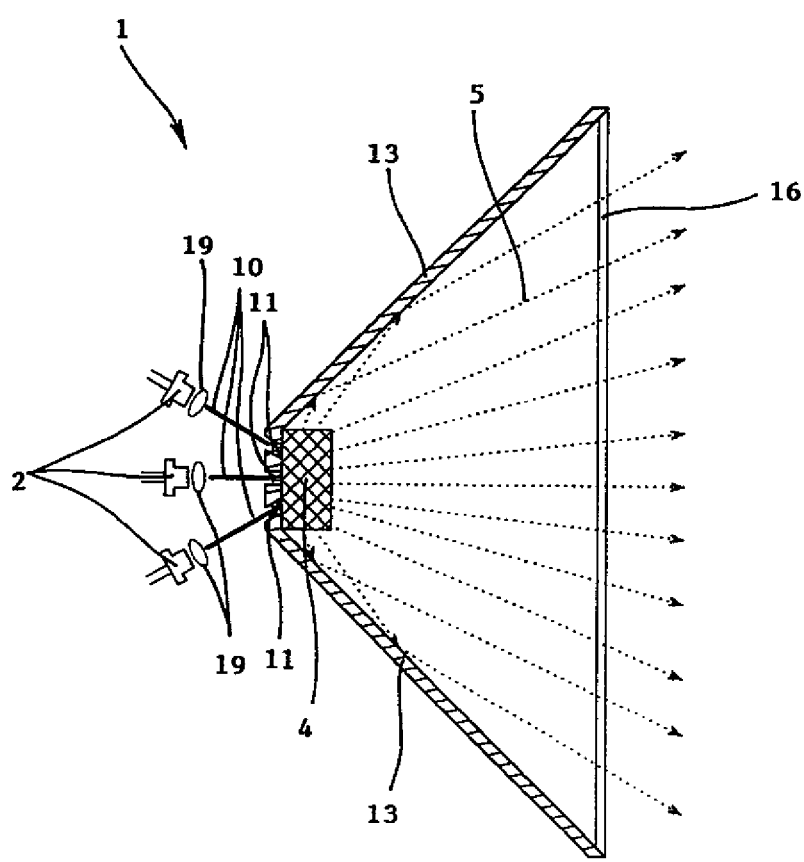
FIG. 3 illustrates a light source with several laser diodes.

FIG. 3 depicts the example of embodiment the light source 1, which is of similar construction as in the example from FIG. 2. The difference is in the multiplication of the solid-state laser sources 2 of the excitation radiation 3 for the increase in luminance of the light source 1. The laser diodes may be spatially moved from each other, so that there is again the decrease in the heating up of the laser diodes with the heat from the single crystal phosphor 4.

Figure 4:
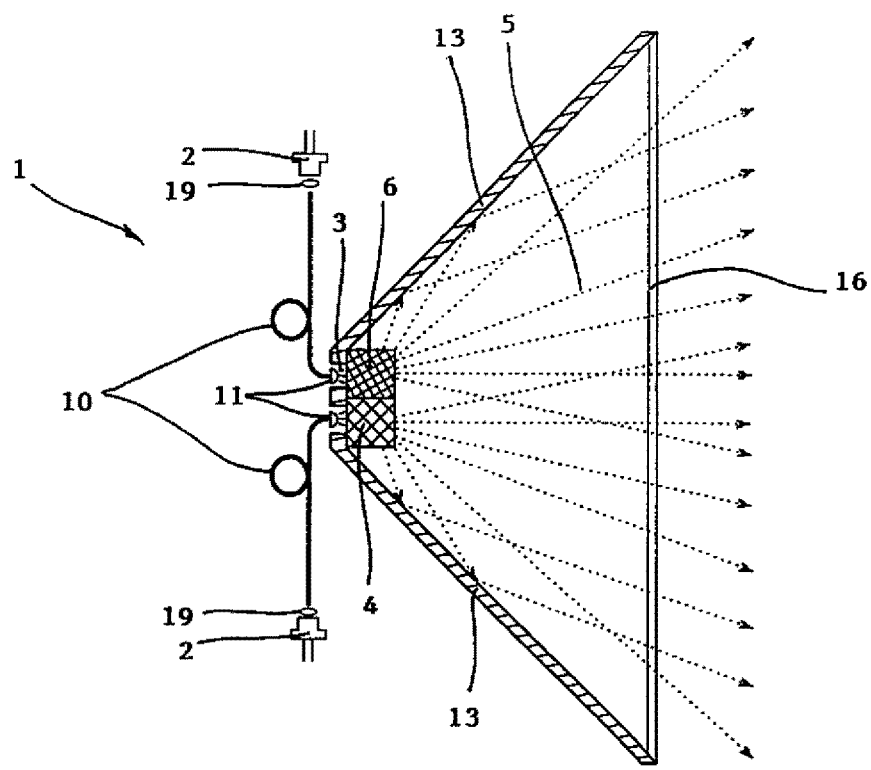
FIG. 4 illustrates a light source with two different phosphors.

FIG. 4 depicts the example of the light source 1, which is provided with a single crystal phosphor 4 and a secondary phosphor 6. The secondary phosphor 6 is created with for example single crystal material described with the $(Gd, Lu, Eu)_3Al_5O_{12}$ formula or with a single crystal material described with $(Y, Ti)AlO_3$. The secondary phosphor 6 radiates extracted light 5 of a different color, here it is e.g. orange-red, so that its mixing with the extracted light 5 of the single crystal phosphor 4 changes the resulting color of the light of the light sources 1. Any known luminescent material may be used for the production of the secondary phosphor 6 too.

Figure 5:
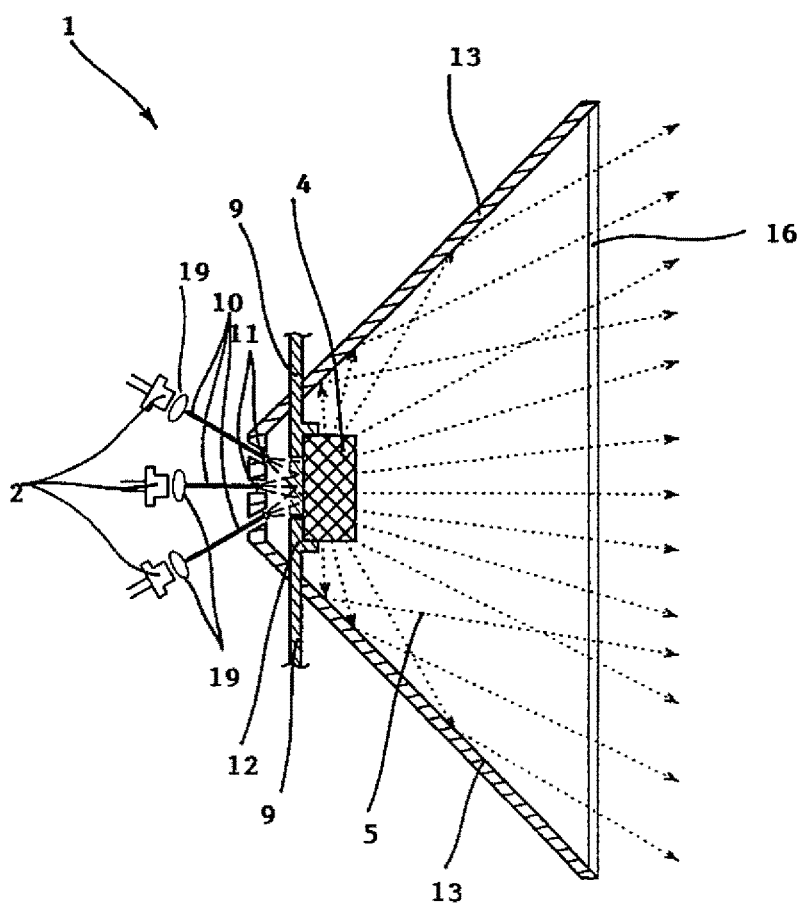
FIG. 5 depicts a light source whose single crystal phosphor is fitted on a carrier in the cooler.

FIG. 5 depicts the example of the light source 1, which is provided with a cooler 9 to take away the generated heat. The cooler 9 protrudes out of the internal space of the element 13 for directing the extracted light 5, and inside the element 13 it is formed in the shape of a carrier 12 onto which the single crystal phosphor 4 is fixed. The supply of the excitation radiation 3 is similar as in the example of FIG. 3.

Figure 6:
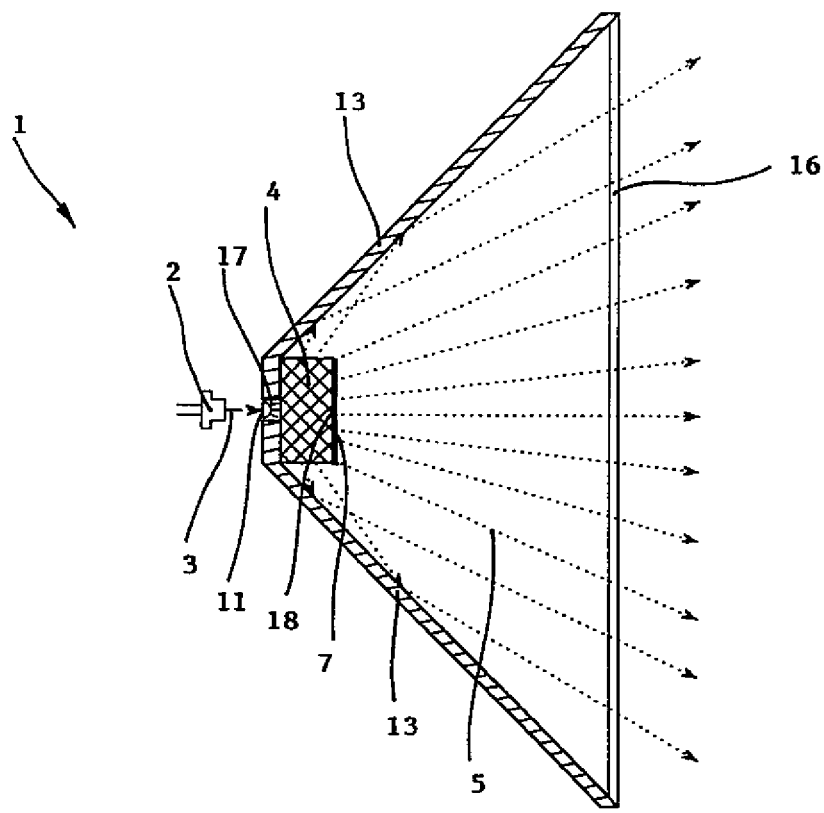
FIG. 6 represents a light source with an optic lens for the modification of the light beam of the excitation radiation.

FIG. 6 depicts the example of embodiment the light source 1 which uses only one laser diode as the source of the excitation radiation 3. The laser diode has sufficient output so that it is not necessary to conduct the excitation light beam to the single crystal phosphor 4 from distance with e.g. an optic fiber 10. The surface of single crystal phosphor 4 is provided with an anti-reflex layer 7. An optic lens 11 is used to scatter the excitation light beam onto as large as possible part of the excitation surface 17.

Figure 7:
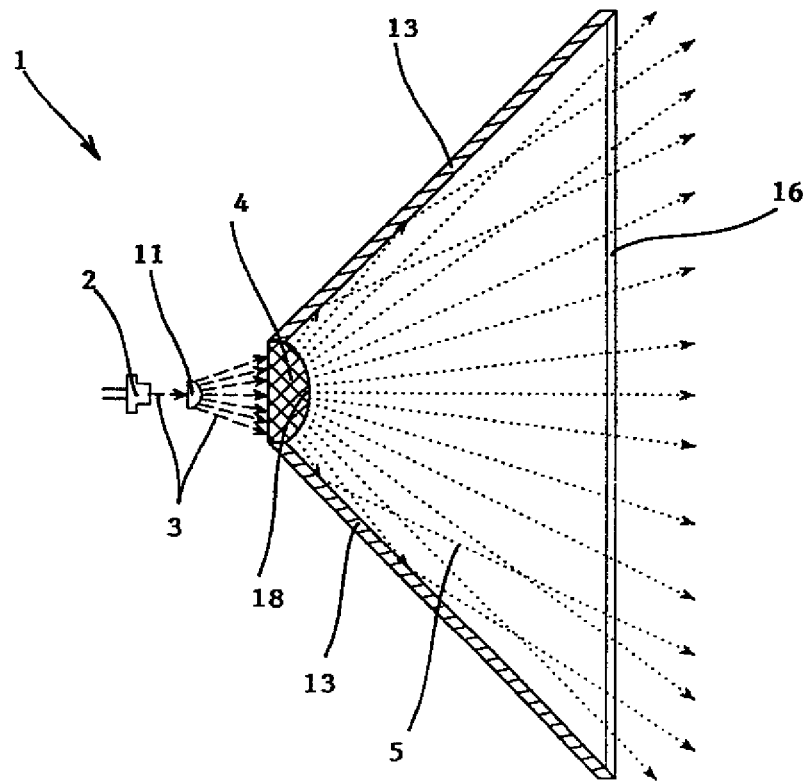
FIG. 7 represents a light source with a single crystal phosphor which has a rounded shape of the emission surface.

FIG. 7 depicts the example of embodiment the light source 1 which uses the single crystal phosphor 4 with a rounded emission surface 18. The excitation surface 17 is enlarged and the excitation radiation 3 is evenly scattered onto it with the optic lens 11. The rounding of the emission surface 18 decreases the occurrence of the light beams total reflection.

Figure 8:
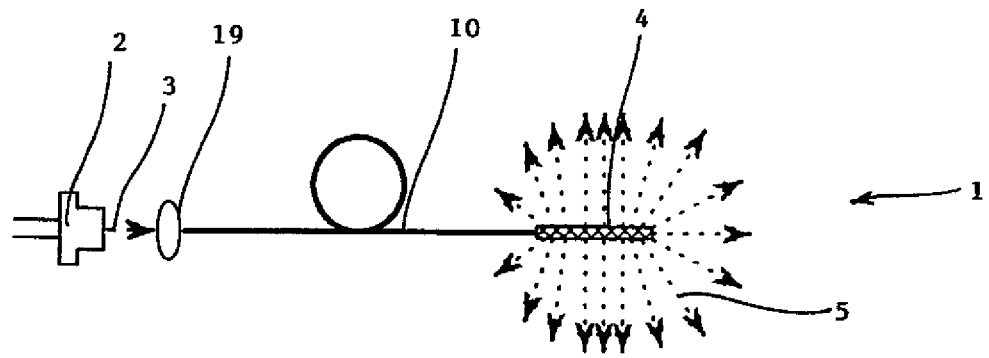
FIG. 8 represents other possible arrangement of light sources where the single crystal phosphor is firmly fixed to the optic fiber.
Figure 8:
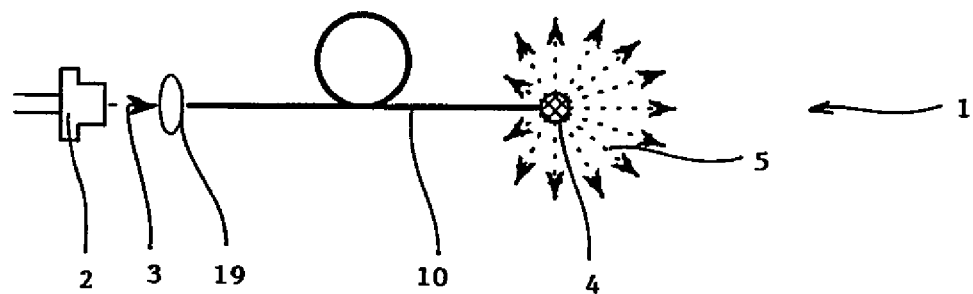

FIG. 8 depicts the example of embodiment the light source 1 which includes the single crystal phosphor 4 with connected optic fiber 10. The phosphor 4 is in the shape of a cylinder or a ball and radiates evenly in the all directions. The phosphor 4 is also provided with structuring 8 which makes light extraction easier.

Figure 9:
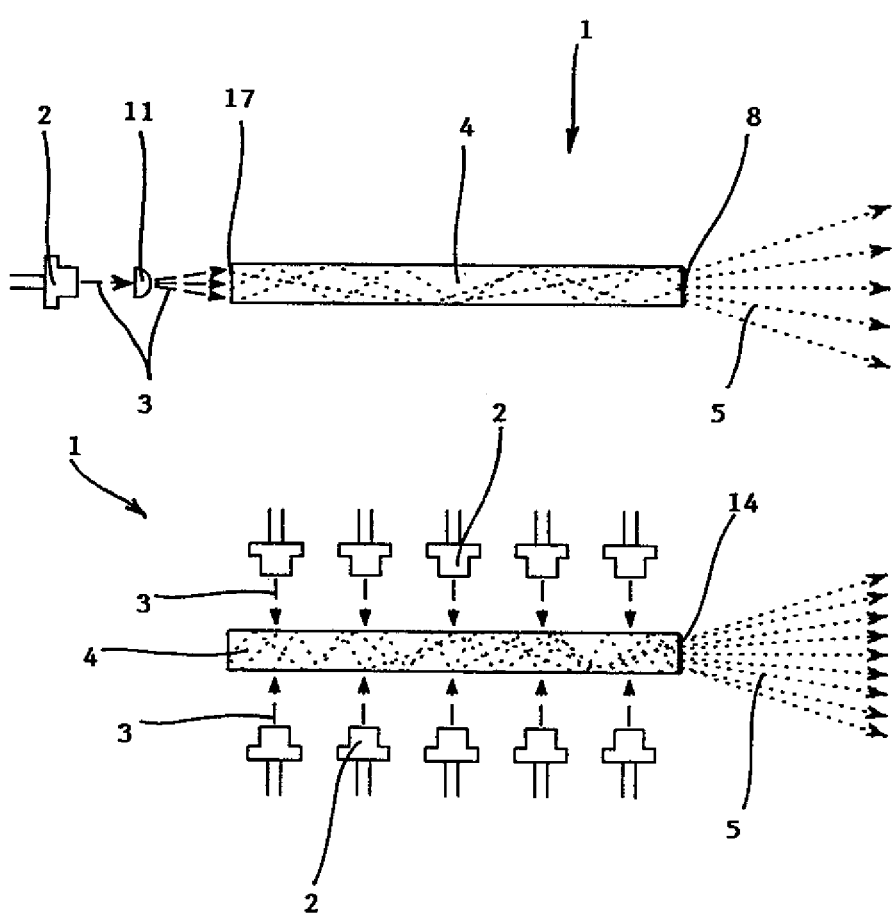
FIG. 9 depicts a light source in which the single crystal phosphor is used to conduct the light.

FIG. 9 depicts another example of embodiment the light source 1. The laser diode produces excitation radiation 3 which is guided via the optic lens 11 to the single crystal phosphor 4 that is machined into the shape of an elongated rectangular cuboid or cylinder. The side walls of the phosphor 4 are polished with the exception of the emission face 14, located in the front of the rectangular cuboid or cylinder base. Due to the high refractive index of the material of the phosphor 4 there occurs a total light reflection on the interface of the polished surfaces with the surrounding environment and the waveguiding character of the material of the single crystal phosphor 4 manifests itself. The emission face 14 may be ground or provided with an anti-reflex layer which enables the extraction of light 5 from the single crystal phosphor 4 directly in the place of the emission face 14. To supply the excitation radiation 3 it is also possible to use collimation lenses 19, optic fibers 10, optic lenses 11, similarly as in the preceding embodiments of this invention.

It is also possible to use several diodes for the excitation of the single crystal phosphor 4 which are located along its longer polished side and thus it is possible to utilize maximum surface for the excitation of the single crystal phosphor 4. With the emission from an active center, the extracted light 5 is emitted in all directions and due to the polished surfaces there occurs total reflection until the extracted light reaches the emission surface 18 of the face 14 where it is outcoupled from the single crystal phosphor 4.

Figure 10:
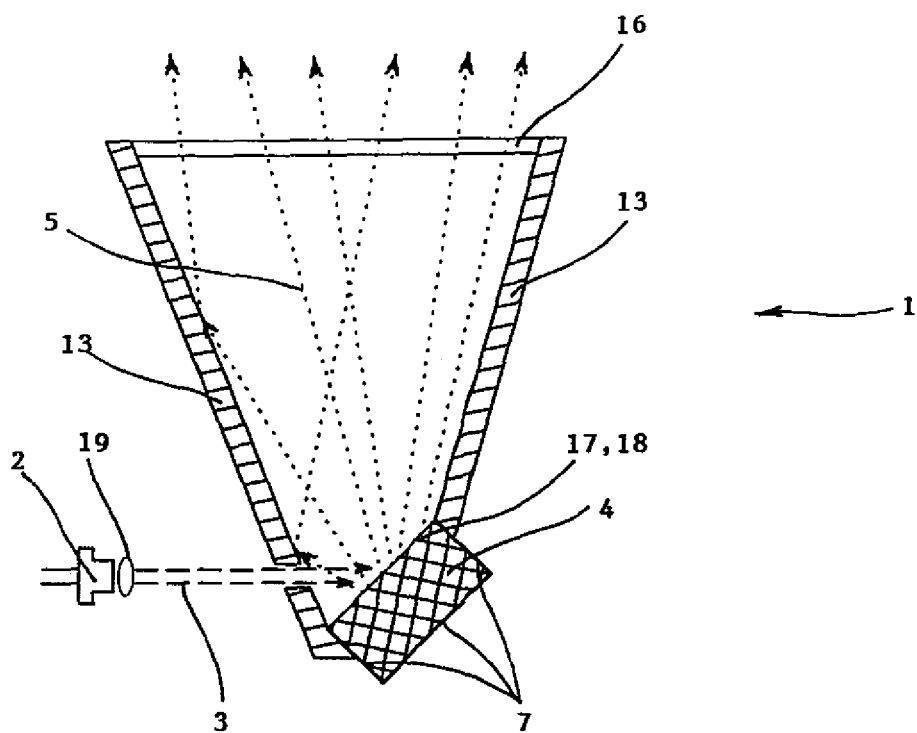
FIG. 10 depicts a light source with a reflective arrangement of the single crystal phosphor.

FIG. 10 depicts another example of embodiment the light source 1 whose single crystal phosphor 4 has excitation and emission surfaces 17 and 18 simultaneously on one of the walls of the body of the single crystal phosphor 4. The surface of the remaining walls of the body of the single crystal phosphor 4 is treated to induce total light reflection back into the interior of the phosphor 4.

Figure 11:
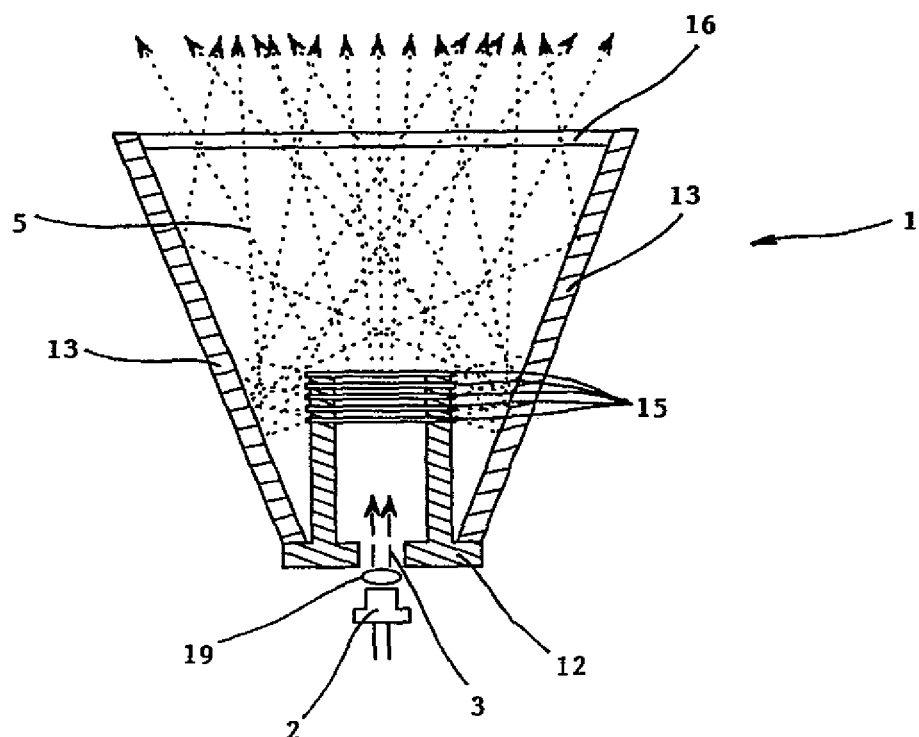
FIG. 11 represents a light source with a phosphor created with a sandwich structure.

FIG. 11 depicts an example of embodiment the light source 1 where the phosphor is created from thin plates 15 cut out from the single crystal phosphor 4 and 6. Two kinds of material were utilized to produce the plates 15 which differ in the maximum wavelength of emitted light. Therefore the resulting light of the light source is mixed and as a result it has a more pleasant color. The individual plates 15 are put on the carrier 12 alternately one over the other. This sandwich structure absorbs more efficiently the excitation radiation 3 which passes with decreasing intensity into plates 15 of the phosphor located higher in the structure until it is completely absorbed.

Figure 12:
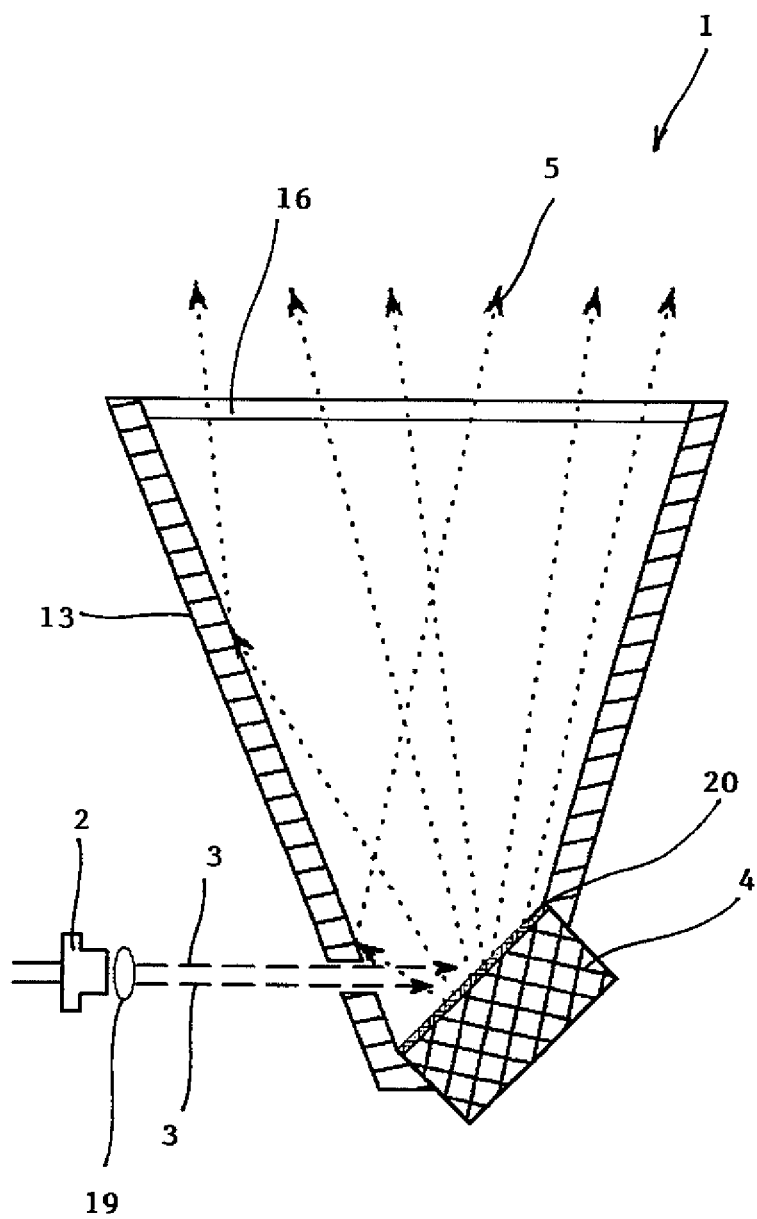
FIG. 12 represents a light source with a single crystal phosphor provided with a crushed material layer.

FIG. 12 depicts an example of embodiment the light source 1 where a layer 20 of a crushed material for the production of single crystal phosphors 4 is applied onto the excitation surface 17 and emission surface 18 of the single crystal phosphor 4. The layer 20 is applied with the plasma deposition method. Two different materials are mixed in the layer 20 to admix the requested correlated color temperature of the extracted light 5.

INDUSTRIAL APPLICABILITY

The light source according to the invention can be utilized in optic projection devices, for public lighting, in lighting systems for defense and weapons systems, in factory and production premises, halls, warehouses, in automotive industry and everywhere where efficient lighting is required.

OVERVIEW OF THE MARKINGS USED IN THE DRAWINGS

1 Light source
2 Solid-state laser source
3 Excitation coherent radiation
4 Single crystal phosphor
5 Emitted light
6 Secondary phosphor
7 Anti-reflex layer
8 Structure on the phosphor surface
9 Cooler
10 Optic fiber
11 Optic lens
12 Carrier
13 Element to direct extracted light
14 Single crystal phosphor emission face
15 Thin plate
16 Protective element
17 Excitation surface
18 Emission surface
19 Collimation lens
20 Single crystal phosphor crushed material layer

The invention claimed is:
1. A light source comprising:
at least one solid-state laser source for emitting coherent excitation radiation, and
at least one single crystal phosphor containing at least one doping element for at least partial conversion of the excitation radiation into extracted light with wavelengths in the visible spectrum,
wherein the single crystal phosphor is formed with oxide-type compound meeting the general formula

$$(A_x Lu_{1-x})_a Al_b O_{12} : Ce_c$$

where:
- A is at least one of the chemical elements from the Y, Gd, Tb group,
- a is a number from the value interval from 0.5 to 20,
- b is a number from the value interval from 0.5 to 20,
- c is a positive number from the value interval from 0.0005 to 0.2,
- x is a positive number from the value interval from 0 to 1,
- and the value of the stoichiometric ratio a:b ranges between 0.5 to 0.7.

2. A light source according to claim 1, wherein the values of c and x numbers are defined by the intervals:
0.0005<c<0.03
0.0005<x<0.9999.

3. A light source according to claim 1, wherein the single crystal phosphor contains induced color centers connected with oxygen vacancies.

4. A light source according to claim 1, wherein the single crystal phosphor is made from a single crystal ingot.

5. A light source according to claim 1, wherein the solid-state laser source has a maximum emission of light wavelengths in the range of 340 nm to 480 nm, and where the extracted light is white light with a correlated color temperature ranging from 2700 K to 10000 K.

6. A light source according to claim 1, wherein the single crystal phosphor forms an optic element with a shape selected from the group consisting of a rectangular cuboid, hemisphere, spherical cap, right circular cone, pyramid, polyhedron, and symmetrical shape, for protecting the extracted light in a desired direction.

7. A light source according to claim 1, wherein at least a portion of the single crystal phosphor volume is structured to at least one of create color-homogenized scattered extracted light, and to maximize projection of the extracted light in a desired direction.

8. A light source according to claim 1, further comprising a secondary phosphor connected to the single crystal phosphor, the secondary phosphor having a maximum emission of light wavelengths in the range of 560 nm to 680 nm, for changing the correlated color temperature of the resulting extracted light.

9. A light source according to claim 1, further comprising a cooler connected to the single crystal phosphor.

10. A light source according to claim 1, further comprising at least one of a light-guiding optic fiber or a light guiding planar optic waveguide, the single crystal phosphor connected to the at least one of a light-guiding optic fiber or a light guiding planar optic waveguide with an optical bonding.

11. A light source according to claim 1, further comprising an optic lens between the solid-state laser source and the single crystal phosphor, to direct the excitation radiation to the excitation surface of the single crystal phosphor.

12. A light source according to claim 1, further comprising at least one carrier carrying the single crystal phosphor, and at least one element to direct the extracted light from the single crystal phosphor.

13. A light source according to claim 1, wherein the single crystal phosphor has the shape of an elongated rectangular cuboid or cylinder, the sides of the single crystal phosphor are polished and the face of the single crystal phosphor from which the emitted light is emitted is ground, provided with an anti-reflex layer, or provided with structuring to make the extraction of the emitted light easier.

14. A light source according to claim 1, wherein the excitation surface of the single crystal phosphor is also the emission surface too.

15. A light source according to claim 1, wherein the single crystal phosphor is provided with at least one surface treatment selected from the group consisting of: ground surface, polished surface, surface provided with an anti-reflex layer, structured surface, and a surface provided with a layer of crushed single crystal phosphor material.

16. A light source according to claim 15, wherein the single crystal phosphor is provided with the surface provided with the layer of the crushed material, such layer composed of at least two materials of single crystal phosphors with different properties.

17. A light source according to claim 1, wherein the single crystal phosphor is composed of at least two thin plates, arranged in a sandwich structure.

18. A light source according to claim 17, wherein the thin plates are formed from a single crystal phosphor having different characteristics.

* * * * *